(12) United States Patent
Chen et al.

(10) Patent No.: US 6,710,240 B1
(45) Date of Patent: Mar. 23, 2004

(54) REGISTER INCORPORATING A TOGGLE-JOINT MECHANISM BETWEEN OPEN AND CLOSED POSITION

(75) Inventors: Jin-Shian Chen, Hsin-Chuang (TW); Hsu-Jung Lin, Hsin-Chuang (TW); Chien-Chung Li, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/617,803

(22) Filed: Jul. 14, 2003

(30) Foreign Application Priority Data

Apr. 24, 2003 (TW) ..................................... 92206545 U

(51) Int. Cl.[7] .................................................. H05K 7/20
(52) U.S. Cl. .................... 174/17 VA; 174/135; 174/50; 361/695; 361/687; 484/184
(58) Field of Search ............................. 174/17 VA, 50, 174/17 R, 16.1, 135; 220/3.2, 3.8, 4.02; 361/676, 678, 687, 694, 695, 690; 454/184, 228, 237, 339, 353, 335; 165/80.3; 236/49.1

(56) References Cited

U.S. PATENT DOCUMENTS

| | | | | |
|---|---|---|---|---|
| 4,648,007 A | * | 3/1987 | Garner | 361/695 |
| 4,887,522 A | * | 12/1989 | Kuno et al. | 454/333 |
| 5,793,610 A | * | 8/1998 | Schmitt et al. | 361/695 |
| 5,890,959 A | * | 4/1999 | Pettit et al. | 454/184 |
| 5,892,195 A | * | 4/1999 | Aufermann et al. | 361/676 |
| 6,007,421 A | * | 12/1999 | Schwarz | 454/156 |
| 6,135,880 A | * | 10/2000 | Ho et al. | 454/335 |
| 6,181,557 B1 | * | 1/2001 | Gatti | 361/695 |
| 6,330,155 B1 | * | 12/2001 | Remsburg | 361/695 |
| 6,407,331 B1 | * | 6/2002 | Smith et al. | 174/17 VA |
| 6,417,443 B1 | * | 7/2002 | Smith | 174/17 VA |
| 6,579,168 B1 | * | 6/2003 | Webster et al. | 361/695 |

* cited by examiner

Primary Examiner—Dean Reichard
Assistant Examiner—Angel R. Estrada
(74) Attorney, Agent, or Firm—Troxell Law Office PLLC

(57) ABSTRACT

The present invention provides a register incorporating a toggle-joint mechanism between open and closed position, which is configured to an outlet of a fan, including: a base portion, having a first pivoted joint and a second pivoted joint respectively disposed on two ends and a third pivoted joint disposed between the first pivoted joint and the second pivoted joint, wherein a lock portion is disposed on the base portion; two air guide plates, each of them having a recess on its corresponding side for engaging each other, wherein each of the air guide plates has a pivoted axis respectively disposed at two edges of one end. By the pivoted axis, two air guide plates are pivotally connected with the first pivoted joint, the second pivoted joint and the third pivoted joint. Therefore, the air guide plates are easy to be pivotally connected on the base portion and the base portion is easy to configure to the outlet of the fan.

1 Claim, 6 Drawing Sheets

REGISTER INCORPORATING A TOGGLE-JOINT MECHANISM BETWEEN OPEN AND CLOSED POSITION

REFERENCE CITED

1. U.S. Pat. No. 6,181,557

FIELD OF THE INVENTION

The present invention is related to a register incorporating a toggle-joint mechanism between open and closed position. More particularly, in the present invention, air guide plates are easy to be pivotally connected on the base portion and the base portion is easy to configure to the outlet of the fan.

BACKGROUND OF THE INVENTION

The conventional large-sized cooling fan assembly (as shown in FIG. 5) includes: a case 5 with an outlet 51 in one end, wherein at least one fan 52 is disposed in the case 5. The fan 52 could be a centrifugal blower. The fan 52 is corresponding to the outlet 51 in one end of the case 5 so as to blow the air generated by the fan 52 out from the outlet 51. The fan 52 can be operated alone or together, depending on the heat dissipation needs. The conventional large-sized cooling fan assembly can operate the fan 52 alone or together with other fans. It will be fine to operate the fan 52 together with other fans. However, when single fan 52 in the case 5 is operated, the sir generated by the fan 52 usually will blow back to the case 5 and the hot air will cycle in the case 5, which would be undesirable.

In another conventional large-sized cooling fan assembly (as shown in FIG. 6), the cooling fan assembly includes: a case 6 with an outlet 61 in one end, wherein an air guide plate 62 is pivotally connected in the outlet 61 to work as a shelter. At least one centrifugal blower 63 is disposed in the case 6. The fan 63 is corresponding to the outlet 61 in one end of the case 6 so that air generated by the fan 63 can output from the outlet 61. The fan 63 can be operated alone or together, depending on the heat dissipation needs. Although the air guide plate 62 can prevent the shortcomings mentioned above, since the air guide plate 62 is a one-piece plate, the single fan 63 in the case 6 will lack air power to push the air guide plate 62 when being operated alone. The air guide plate 62 can not be opened. Therefore, the above conventional structures are not able to meet real needs.

SUMMARY OF THE INVENTION

The main objective of the present invention is to provide air guide plates easy to be pivotally connected on the base portion and make the base portion easy to configure to the outlet of the fan.

To achieve the above objective, the register incorporating a toggle-joint mechanism between open and closed position in the present invention is provided, which is configured to an outlet of an fan, including: a base portion, having a first pivoted joint and a second pivoted joint respectivety disposed on two ends and a third pivoted joint disposed between the first pivoted joint and the second pivoted joint, wherein the third pivoted joint is larger than the first pivoted joint and the second pivoted joint, a lock portion is disposed on the base portion; two air guide plates, each of them having a recess on its corresponding side for engaging each other, wherein each of the air guide plates has a pivoted axis respectively disposed at two edges of one end. By the pivoted axis, two air guide plates are pivotally connected with the first pivoted joint, the second pivoted joint and the third pivoted joint. Therefore, the air guide plates are easy to be pivotally connected on the base portion and the base portion is easy to configure to the outlet of the fan.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE INVENTION

The following descriptions of the preferred embodiments are provided to understand the features and the structures of the present invention.

Figure 1:
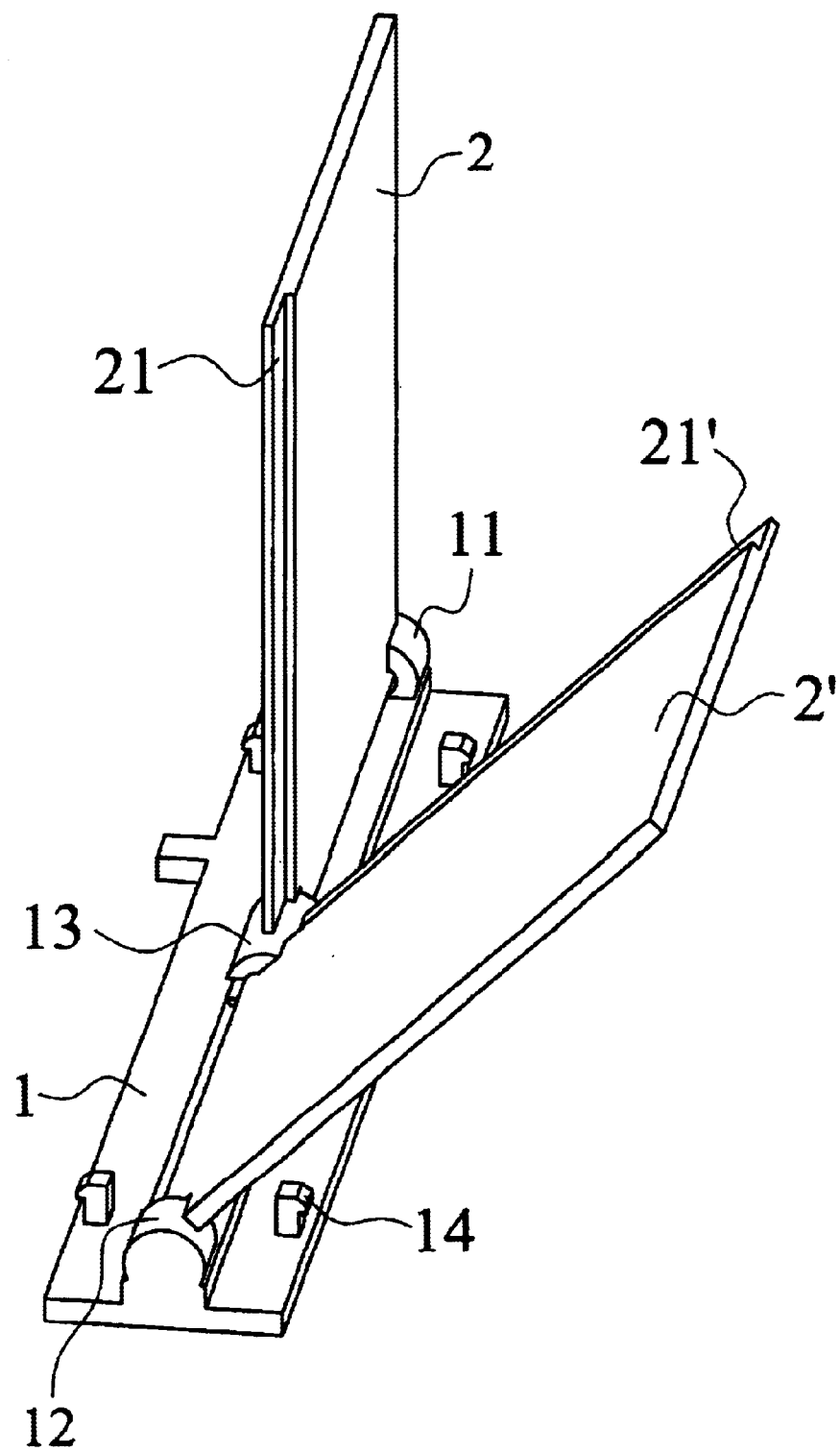
FIG. 1 is a diagram showing an outward appearance of the present invention.
Figure 2:
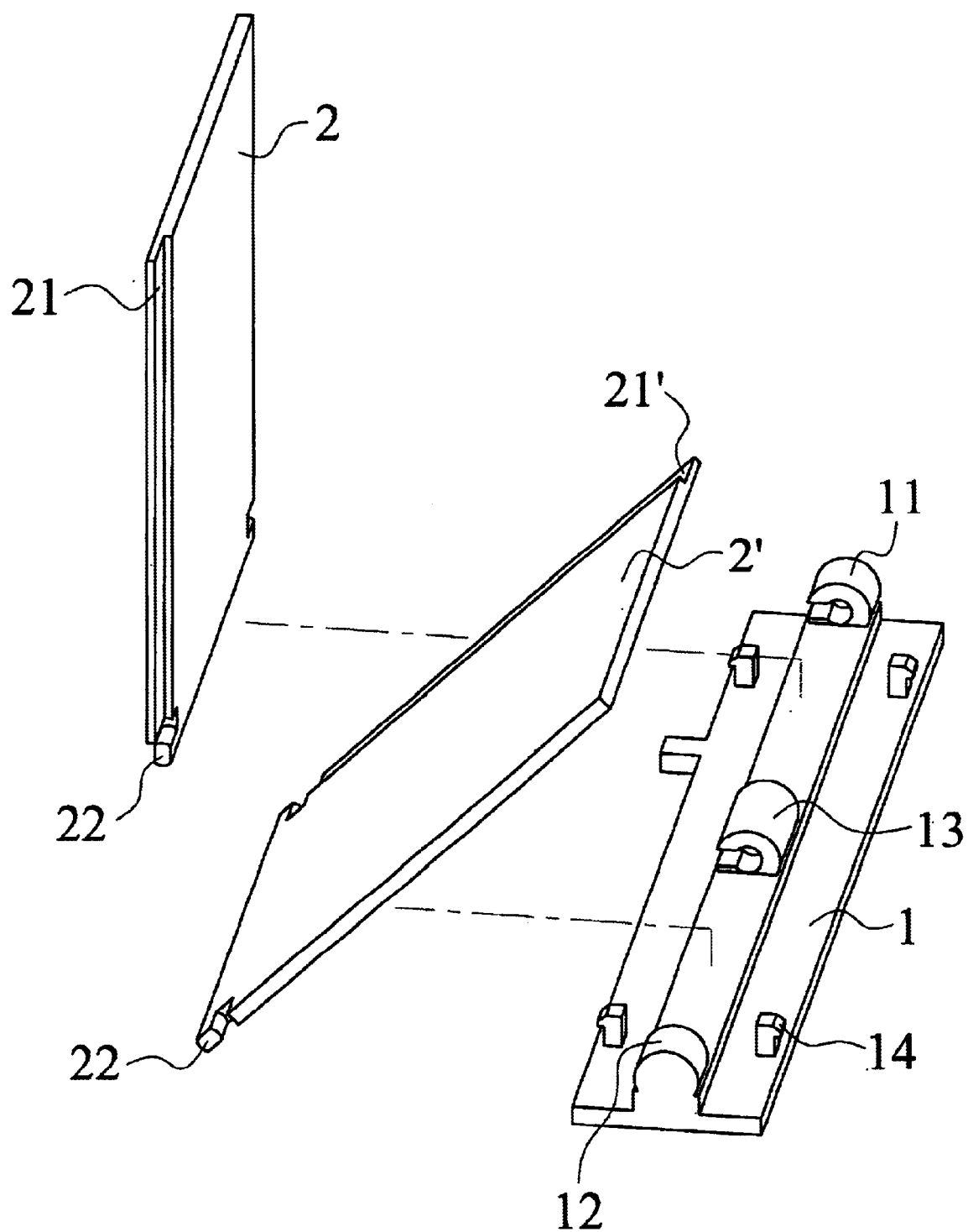
FIG. 2 is a separation diagram of the present invention.

FIG. 1 and FIG. 2 are respectively a diagram showing an outward appearance of the present invention and a separation diagram of the present invention. As shown in the diagrams, the present invention provides a register incorporating a toggle-joint mechanism between open and closed position, which is configured to an outlet of a fan. The claimed invention composed of a base portion and two air guide plates pivotally connects the air guide plate on the base portion.

The base portion 1 has a first pivoted joint 11 and a second pivoted joint 12 respectively disposed on two ends of one side and a third pivoted joint 13 disposed between the first pivoted joint 11 and the second pivoted joint 12, wherein the third pivoted joint 13 is larger than the first pivoted joint 11 and the second pivoted joint 12. The first pivoted joint 11, the second pivoted joint 12, and the third pivoted joint 13 are disposed in the middle of one side of the base portion 1. A lock portion 14 is disposed on the base portion 1 (disposed on the same side along with the first pivoted joint 11, the second pivoted joint 12, and the third pivoted joint 13). The lock portion 14 is disposed on one side of the base portion 1 adjacent to four corners.

Two air guide plates 2, 2' have recesses 21, 21' respectively on the corresponding side. By the recesses 21, 21' disposed on the corresponding side, the two air guide plates 2, 2' engages together. Each of the air guide plates 2, 2' has a pivoted axis 22 respectively disposed at two edges of one end. By the pivoted axis 22, two air guide plates 2, 2' are pivotally connected with the first pivoted joint 11, the second pivoted joint 12 and the third pivoted joint 13. Since the third pivoted joint 13 is larger than the first pivoted joint 11 and the second pivoted joint 12, the third pivoted joint 13 can connect to two pivoted axes 22 at the same time. Therefore, the above structure as a whole becomes a novel lock structure of the air guide plate.

Figure 3:
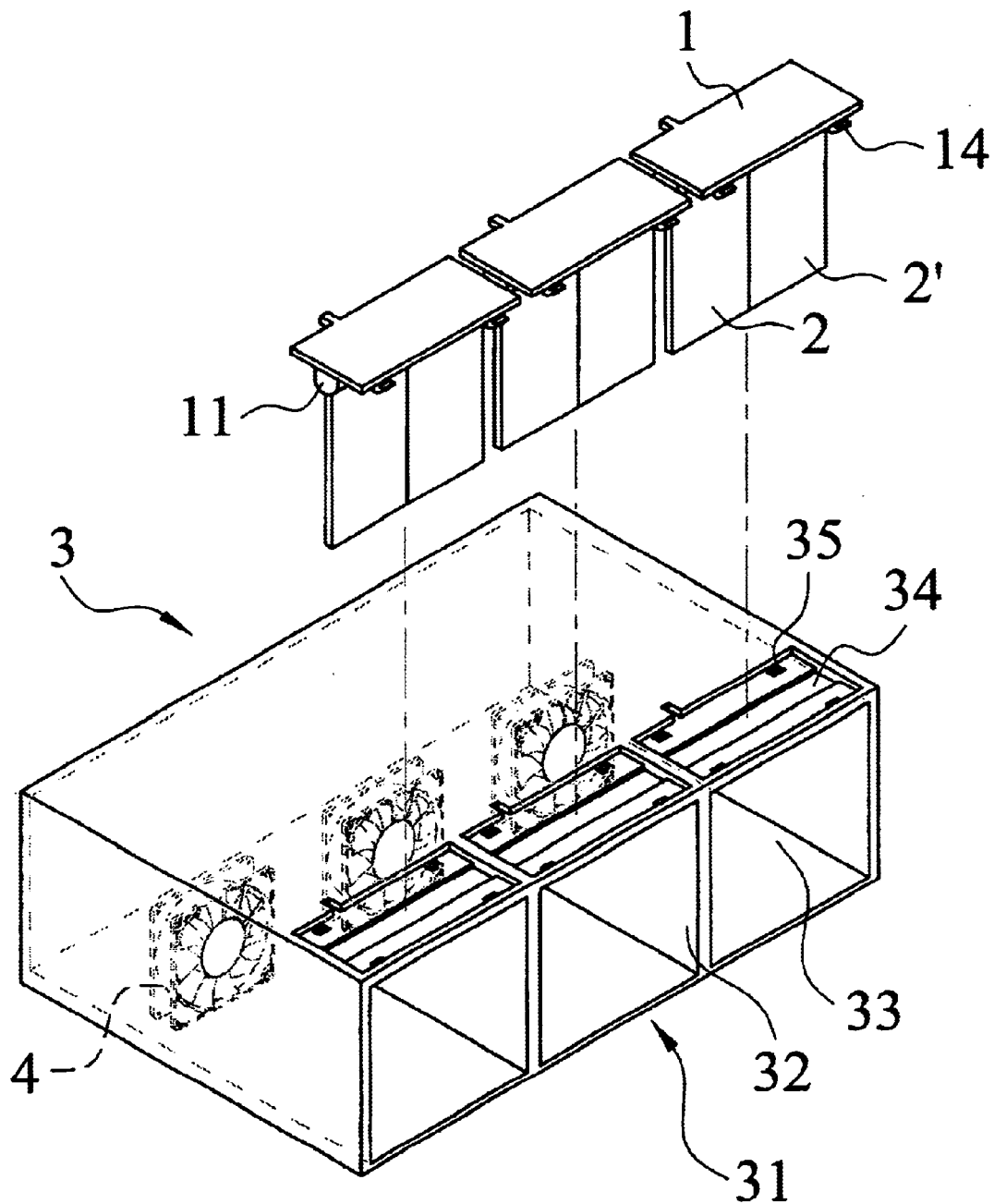
FIG. 3 is a diagram showing a fabrication view of the present invention.
Figure 4:
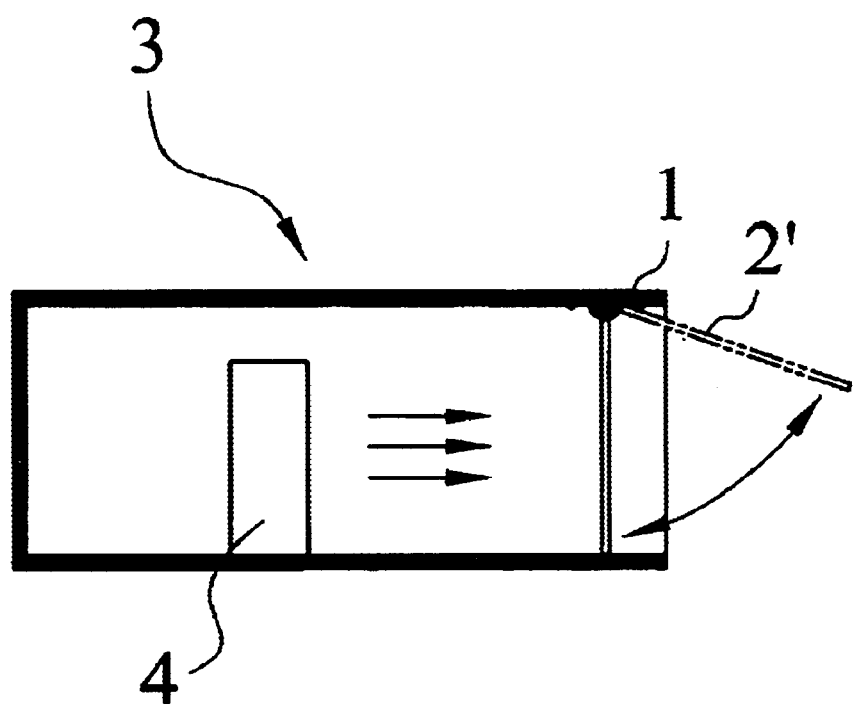
FIG. 4 is a cross-section diagram showing a view in operation configuration of the present invention.
Figure 5:
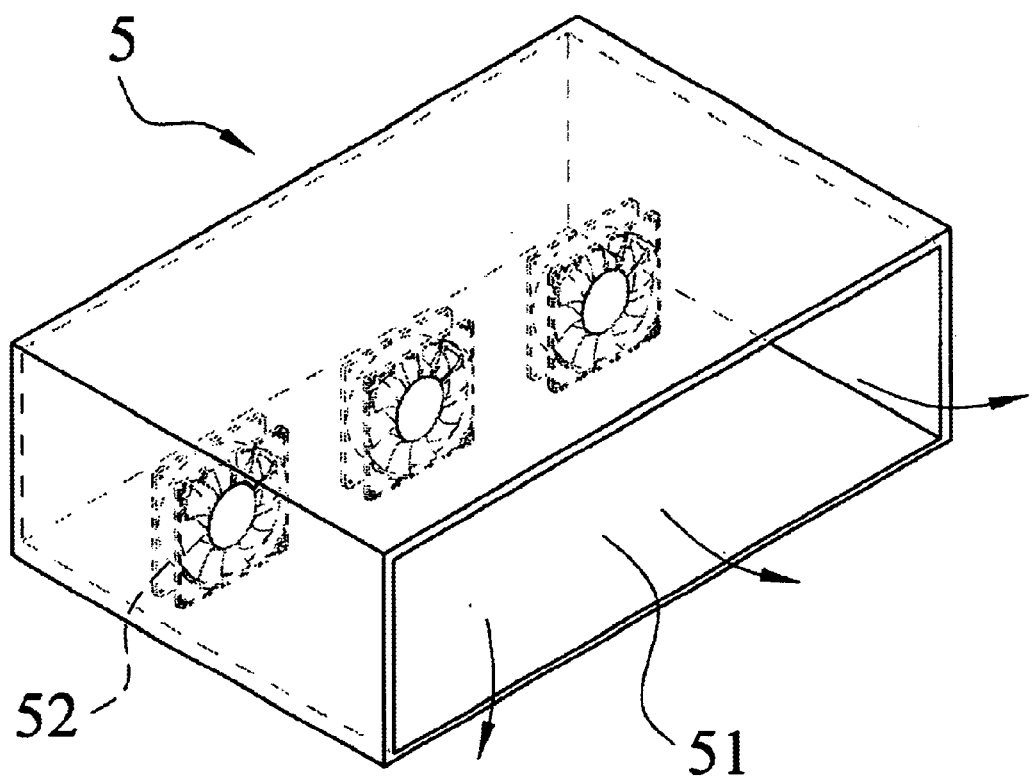
FIG. 5 is a diagram of the prior art.
Figure 6:
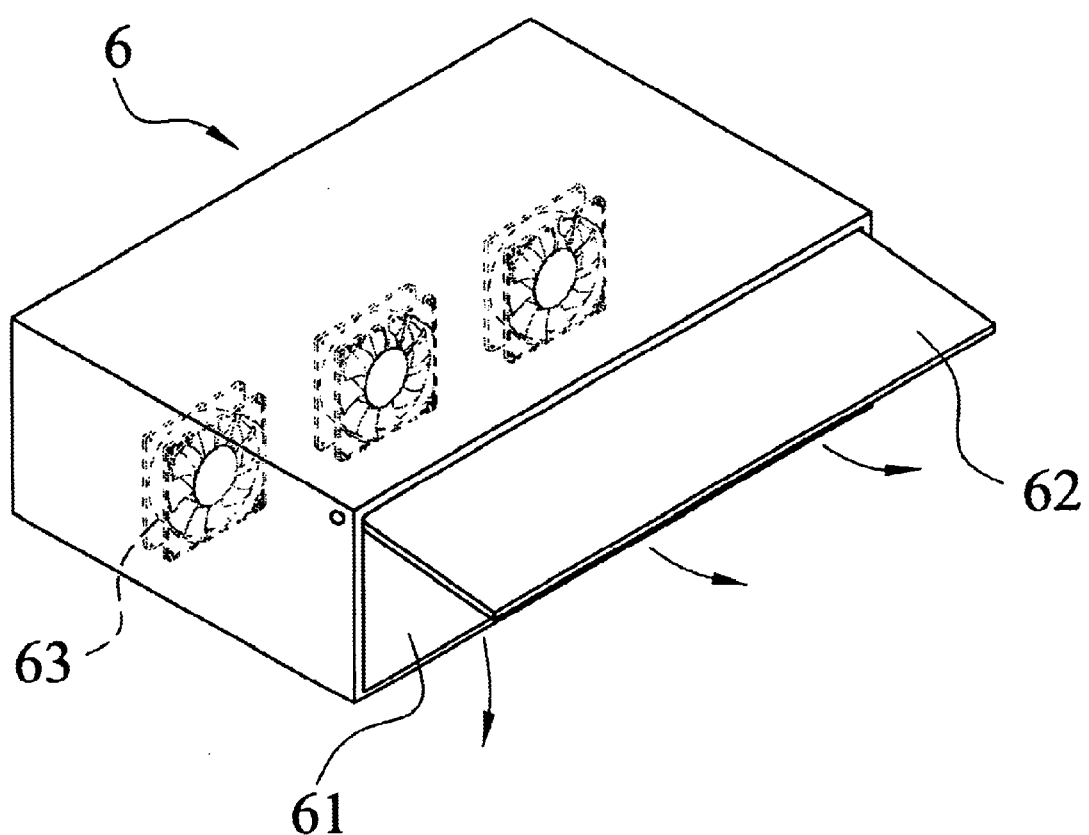
FIG. 6 is another diagram of the prior art.

FIG. 3 and FIG. 4 are respectively a diagram showing a fabrication view of the present invention and a cross-section diagram showing a view in operation configuration of the present invention. As shown in the diagrams, the present invention is configured to an outlet of a fan. Take a large-sized fan assembly as an example, the fan assembly includes: a case 3 having an outlet 31 in one end, wherein a plurality of separation boards 32 may be disposed in between the outlet 31 and form at least one channel 33. An opening 34 is disposed on the top side of the case 3 along the outlet 31. A hole 35 disposed in a proper position along the opening 34 corresponds to the lock portion 14 of the base portion 1. At least one fan 4, which could be a centrifugal blower, is disposed in the case 3. The fan 4 corresponding to the channel 33 in one end of the case 3 allows air generated by the fan 4 to pass through the channel 33. Numbers of the claimed invention can be fabricated together. When fabricating, two air guide plates 2, 2' and the opening 34 in the top side of the case 3 are inserted together, so that two air guide plates 2, 2' are disposed in the channel 33 in one end of the case 3 by means of the opening 34 and become a shelter of the channel 33. Meanwhile, the lock portion 14 of the base portion 1 is corresponding to the top side of the case 1 along with the hole 35 of the opening 34. The lock portion 14 then locks in the hole 35 by pushing the base portion 1 downward. By the relative combination of the lock portion 14 and the hole 35, the base portion 1 can be mounted on the top side of the case 3.

When more than one fan 4 in the case 3 are operated at the same time, the air flow generated by the fan 4 passes through the channel 33 and are guided to the outlet 31 in one end of the case 3. For the time being, the two air guide plates 2, 2' pivotally connect with the first, the second, and the third pivoted joint 11, 12, 13 by the pivoted axis 22. Therefore, when fan 4 blows, the two air guide plates 2, 2' will blow up the two air guide plate 2, 2' by the pivotal combination of the pivoted axis 22 and the first, second, the third pivoted joint 11, 12, 13. The two air guide plates 2, 2' are pushed to open. The two air guide plates 2, 2' are engaged together by the recesses 21, 21' in the corresponding side. Thus, as long as the air generated by the fan 4 blows one of the air guide plates, the two air guide plates 2, 2' will be opened. If only one of the fans 4 are operated, the adjacent two air guide plates 2, 2' will not be blown up and will still work as a shelter. Therefore, by the operation of the single fan 4, air will not blow back into the case 3 from another channel 33, and the hot air will cycle in the case 3. The shortcomings of the conventional structure which has only one piece of air guide plate are improved.

The present invention may be embodied in other specific forms without departing form the spirit of the essential attributes thereof: therefore, the illustrated embodiment should be considered in all respects as illustrative and not restricted, reference being made to the appended claims rather than to the foregoing description to indicate the scope of the invention.

What is claimed is:

1. A register incorporating a toggle-joint mechanism between an open and a closed position, configured to an outlet of a fan, comprising:

a abase portion, having a first pivoted joint and a second pivoted joint respectively disposed on two ends of said base portion and a third pivoted joint disposed between said first pivoted joint and said second pivoted joint, wherein said third pivoted joint is larger than said first pivoted joint and said second pivoted joint, a lock portion is disposed on said base portion; and two air guide plates, each of them having a recess on the corresponding side for engaging each other, wherein each of said air guide plates has a pivoted axis respectively disposed at two edges of one end, by said pivoted axis, said two air guide plates are pivotally connected with said first pivoted joint, said second pivoted joint and said third pivoted joint.

* * * * *